United States Patent [19]

Eno

[11] Patent Number: 4,939,473
[45] Date of Patent: Jul. 3, 1990

[54] TRACKING HARMONIC NOTCH FILTER

[75] Inventor: Frederick L. Eno, Pawcatuck, Conn.

[73] Assignee: The United States of America as represented by the Secretary of the Navy, Washington, D.C.

[21] Appl. No.: 326,776

[22] Filed: Mar. 20, 1989

[51] Int. Cl.⁵ .......................... H03B 1/00; H03K 5/00
[52] U.S. Cl. ..................................... 328/167; 307/521; 307/543
[58] Field of Search ................ 325/167, 127; 307/520, 307/521, 543, 556

[56] References Cited

U.S. PATENT DOCUMENTS

| | | | |
|---|---|---|---|
| 3,795,877 | 3/1974 | Poole | 328/167 |
| 4,151,474 | 4/1979 | Woollvin et al. | 328/167 |
| 4,392,068 | 7/1983 | Welles, II | 328/167 |
| 4,429,309 | 1/1984 | Kipp | 328/167 |
| 4,496,859 | 1/1985 | Crooks | 328/167 |
| 4,549,312 | 10/1985 | Michaels et al. | 328/167 |

Primary Examiner—Stanley D. Miller
Assistant Examiner—Richard Roseen
Attorney, Agent, or Firm—Michael J. McGowan; Prithvi C. Lall

[57] ABSTRACT

An electronic filter for automatically tracking and removing harmonically related interfering electrical signals such as power line interference harmonics without attenuating other signals of interest even though the signals are frequency stable and/or near the interference signal frequencies. The filter comprises a very narrow band electronic commutated capacitor-bank comb-notch filter driven by a counter/decoder circuit which is in turn driven by a phase locked loop. The filter also comprises two narrow band analog filters tuned to the two lowest harmonics of the interfering signal. The summed output of these two filters is applied to the input of the phase locked loop. The phase locked loop locks to the proper multiple of the interfering signal and drives the comb-notch filter at a frequency which causes it to generate notches at unit multiples of the fundamental of the interference frequency. This action is continuous such that center frequencies of the notches are automatically adjusted to compensate for small variations in the interference frequency.

5 Claims, 2 Drawing Sheets

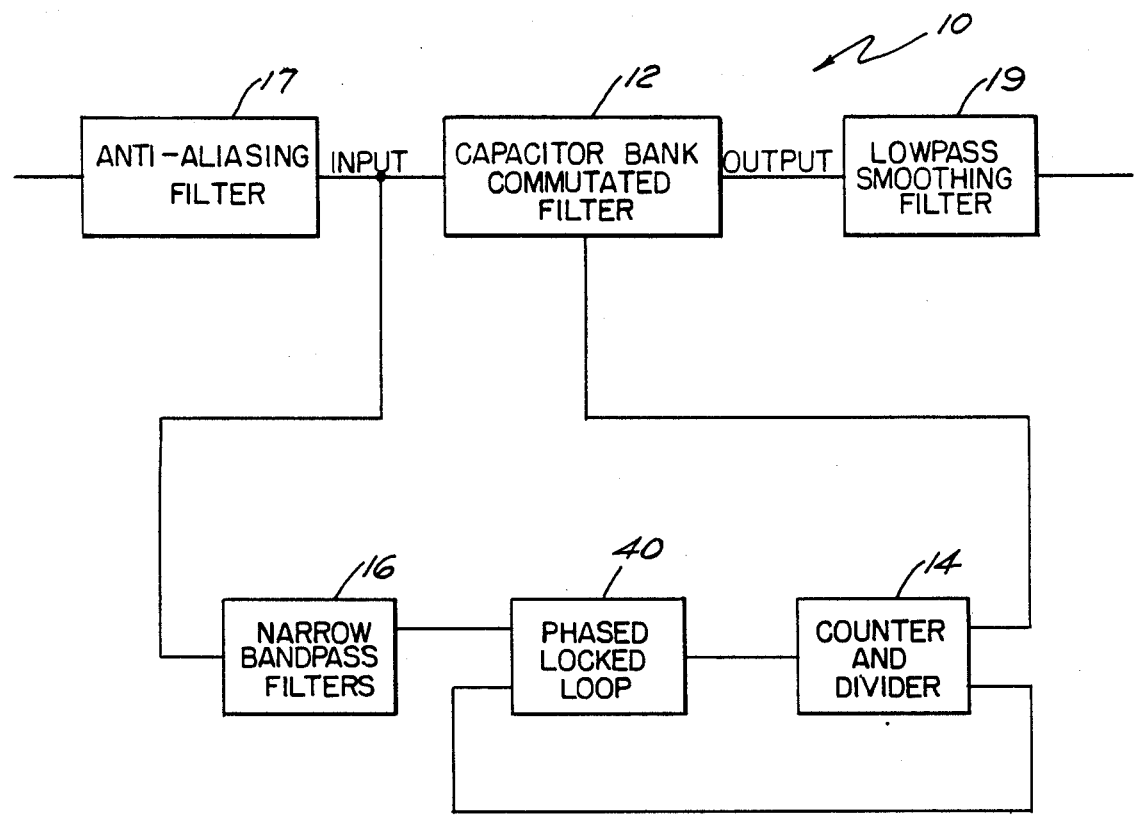
F I G. 1

TRACKING HARMONIC NOTCH FILTER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

Subject invention is related to interfering noise elimination in an electrical circuit and more particularly to a tracking notch filter.

(2) Description of the Prior Art

When low signal level electronic measurements are made, interference from harmonically related interfering signals such as the AC power line and its harmonics is often a problem. Techniques such as shielding and proper grounding are employed to reduce the interference. Once the signals are recorded, such as on a tape recorder, any interference remaining is also recorded. The person analyzing the recorded data must therefore use other means to remove interfering harmonics from the playback signals. Two methods currently used are digital adaptive filtering and analog notch filtering.

Digital adaptive filters locate, track and attenuate time stable harmonics. They effectively attenuate the power line harmonics but have the undesirable effect of indiscriminately reducing the signals of interest with any other stable frequencies.

High Q narrow bandwidth analog notch filters attenuate a very narrow predetermined frequency band per filter and thus do not affect the signals of interest. However, high Q analog circuits display a high sensitivity to component tolerance making the narrow notches unstable and difficult to tune. Since a separate filter must be employed for each power line harmonic, each such filter requires separate tuning. Furthermore, tape recorders add wow and flutter which shift the frequencies slightly, in turn reducing the effectiveness of such fixed frequency analog filters. There is thus a need for a filter which automatically tracks and eliminates interfering harmonics of a power line without distorting the desired signals.

SUMMARY OF THE INVENTION

The tracking harmonic notch filter of the present invention is an electronic analog/digital circuit which overcomes the disadvantages of both the digital adaptive and analog notch filters. It generates very narrow notches at exact multiples of interference frequency. Other frequencies are not attenuated even though they may be time stable or very near the interference components. This filter also continuously tracks small variations of the interference frequency and thereby overcomes errors such as those introduced by AC power generators operating or drifting off 60 Hz and/or by tape recorder wow and flutter.

The notches are generated by a switching process known as "commutation" in conjunction with the reactive action of a capacitor bank. It generates notches at multiples of the rotational frequency of the commutator divided by the number of positions on the commutator. The component values are so chosen that the notches are very narrow. The commutated capacitor-bank comb-notch filter comprises digitally controlled analog switches connected to a bank of capacitors. A phase locked loop oscillator drives the commutator circuit via a counter and a decoder thus determining the frequencies of the notches. Either one or both of the lowest two interfering harmonics of the input signal are sampled by two narrow bandpass filters of conventional analog design. The signal from these bandpass filters is summed and applied to the input of the phase locked loop which then locks to the proper multiple of the interfering signal. In this manner the commutated filter is driven at the proper rotational frequency to generate notches at the exact frequencies of the interfering harmonics. Thus this invention combines two very narrow bandpass filters, a phase locked loop oscillator, and a commutated capacitor-bank comb-notch filter to continuously track and attenuate harmonically related interference noise such as power line harmonics.

One object of this invention is to provide a notch filter which generates multiple harmonically related notches.

Another object of this invention is to provide a means by which the frequencies of these notches can be changed while retaining their harmonic relationship.

Still another object of this invention is to provide for automatic and continuous adjusting of the notch frequencies to track and attenuate interfering harmonics which vary in frequency.

Other objects, advantages and novel features of the invention will become apparent from the following detailed description of the invention when considered in conjunction with the accompanying drawings wherein:

BRIEF DESCRIPTIONS OF THE DRAWINGS

FIG. 1 is a block diagram showing the connection and interrelationship between the functional parts of the filter including a standard anti-aliasing filter connected before the input and a standard smoothing filter connected after the output; and FIG. 2 is a circuit diagram of a tracking harmonic notch filter according to the teachings of subject invention.

DESCRIPTION OF A PREFERRED EMBODIMENT

Figure 2:
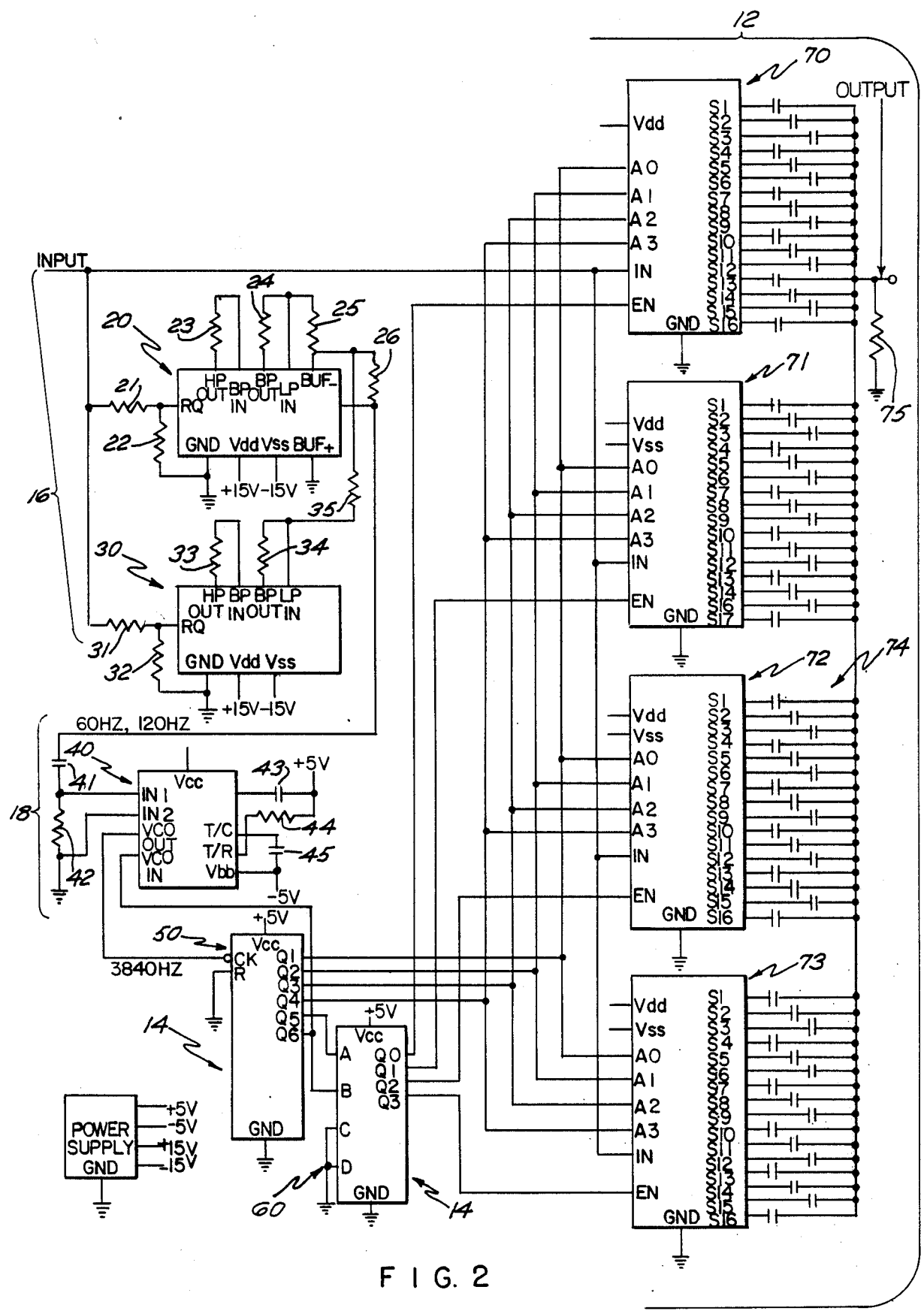

Referring to the drawings wherein like reference characters designate like parts throughout, FIGS. 1 and 2, respectively show a block diagram and a circuit diagram of a tracking harmonic notch filter according to the teachings of subject invention. FIG. 1 is a block diagram of the filter 10 which includes a capacitor-bank commutated filter 12 (components 70 through 75 in FIG. 2) with its output connected to counter and divider circuit 14 (components 50 and 60 in FIG. 2). The input to circuit 12 is obtained from the summed output of a pair of filters 16 (components 20 through 26 and 30 through 35 in FIG. 2). Additionally there is a standard anti-aliasing filter 17 connected before the input to circuit 12 and a standard low pass smoothing filter 19 is used after the output of circuit 12. Referring to FIG. 2, the tracking harmonic notch filter 10 comprises four analog switch integrated circuits 70, 71, 72 and 73, each one of which has its terminal IN connected to the filter INPUT. Terminal A0 of each integrated circuit 70, 71, 72, and 73 is connected to terminal Q1 of counter integrated circuit 50. In like manner, each terminal of terminals A1, A2, and A3 of each of integrated circuits 70, 71, 72, and 73 is connected in parallel to respective terminals Q2, Q3, and Q4 of integrated circuit 50. A capacitor bank 74 comprised of sixty-four capacitors of equal value is divided into four groups of sixteen capacitors. Each of the four integrated circuits 70, 71, 72, and 73, is connected to one group of capacitors in the following manner: one end of each capacitor is connected to integrated circuit terminal S1, S2, S3, S4, S5, S6, S7, S8, S9, S10, S11, S12, S13, S14, S15, and S16 respectively. The other end of each capacitor of the bank of sixty-four is connected to the filter OUTPUT and through load resistor 75 to Power Supply GND. Terminal EN of integrated circuit 70 is connected to terminal Q0 of decoder integrated circuit 60. Terminal EN of integrated circuit 71 is connected to terminal Q1 of integrated circuit 60. Terminal EN of integrated circuit 72 is connected to terminal Q2 of integrated circuit 60. Terminal EN of integrated circuit 73 is connected to terminal Q3 of integrated circuit 60. Terminals Vdd, Vss, and GND of integrated circuits 70, 71, 72 and 73 are connected to Power Supply +15, −15 volts, and GND respectively.

Filter INPUT point 10 is also connected through resistors 21 and 31 to terminals RQ of bandpass integrated circuits 20 and 30 respectively. Terminals RQ of integrated circuits 20 and 30 are also connected through resistor 22 and 32 respectively to Power Supply GND. Resistors 23 and 33 are connected between terminals HP OUT and BP IN of integrated circuits 20 and 30 respectively. Resistors 24 and 34 are connected between terminals BP OUT and LP IN of integrated circuits 20 and 30 respectively. Resistor 25 is connected between terminals BUF− and LP IN of integrated circuit 20. Resistor 26 is connected between terminals BUF− and BUF OUT of integrated circuit 20. Resistor 35 is connected between terminal BUF− of integrated circuit 20 and terminal LP IN of integrated circuit 30. Terminals BUF+ and GND of integrated circuit 20 and terminal GND of integrated circuit 30 are connected to Power Supply GND. Terminals Vdd and Vss of integrated circuits 20 and 30 are connected to Power Supply +15 and −15 volts respectively. Terminal BUF OUT of integrated circuit 20 is connected through capacitor 41 to terminal IN-1 of phase locked loop (PLL) integrated circuit 40. Terminal IN-1 of integrated circuit 40 is also connected through resistor 42 to Power Supply GND. Terminal CTL of integrated circuit 40 is connected through capacitor 43 to Power Supply +5 volts. Terminal T/R of integrated circuit 40 is connected through resistor 44 to Power Supply +5 volts. Terminal T/C of integrated circuit 40 is connected through capacitor 45 to Power Supply −5 volts.

Terminals Vcc, Vbb, and IN-2 of integrated circuit 40 are connected to Power Supply +5, −5 volts, and GND respectively. Terminal VCO OUT of integrated circuit 40 is connected to terminal CK of integrated circuit 50. Terminal VCO IN of integrated circuit 40 is connected to terminal Q6 of integrated circuit 50 and to terminal B of integrated circuit 60. Terminal Q5 of integrated circuit 50 is connected to terminal A of integrated circuit 60. Terminal Vcc of integrated circuits 50 and 60 are connected to Power Supply +5 volts. Terminals GND and R of integrated circuit 50 and terminals GND, C and D of integrated circuit 60 are connected to Power Supply GND.

OPERATION OF THE CIRCUIT

The frequencies indicated on the drawings and discussed in the explanation are representative of the concept of this invention and do not limit its scope. They are used to more clearly explain this invention.

Referring to FIG. 2, the input signal is applied in parallel to analog switches 70, 71, 72 and 73 and narrow bandpass active filters 20 and 30. Resistors 21, 22, 23 and 24 set the center frequency of filter 20 to 60 Hz and the passband to approximately five percent of the center frequency. Likewise, resistors 31, 32, 33 and 34 set the center frequency of filter 30 to 120 Hz and the passband to approximately five percent of the center frequency. The outputs of the filters are summed by a summation circuit comprised of resistors 25, 26 and 35 and an uncommitted operational amplifier within integrated circuit 20. The summed signal will contain a sample of any components present in the input signal within approximately five percent of 60 Hz and/or 120 Hz. The summed signal is applied to input IN-1 of phase locked loop (PLL) 40 through coupling capacitor 41 and ground return resistor 42. Input IN-2 of the PLL is grounded. The free running frequency of the voltage controlled oscillator (VCO) contained within the PLL is set to 3840 Hz nominally by the timing network consisting of resistor 44 and capacitor 45. The 3840 Hz square wave VCO OUT signal is applied to the clock input of modulo sixty-four counter 50. The 60 Hz counter output at Q6 is applied as a feedback signal to the VCO IN input of PLL 40. The PLL performs a continuous phase comparison between the counter output and the summed signal applied to the IN-1 input and generates a control voltage which is filtered by capacitor 43 and applied internally to adjust the VCO frequency such that it locks to sixty-four times that of the signal at IN-1.

Counter 50, decoder 60, analog switches 70 through 73, capacitor bank 74 and load resistor 75 implement a commutated capacitor-bank comb-notch filter as described in L. E. Franks, "N-Path Filters," Chapter 11, pp. 497–498, Modern Filter Theory and Design, edited by Gabor C. Temes and Sanjit K. Mitra, John Wiley, New York (1973). It generates very narrow constant bandwidth notches at unit multiples of commutation frequency divided by the number of switch positions. With the component values chosen the notches are 2 Hz wide centered at unit multiples of the nominal 60 Hz interference.

Each of the analog switches 70, 71, 72 and 73 is a digitally controlled one-pole sixteen-throw analog switch. Because their inputs are connected in parallel and they are controlled in a sequential manner by counter 50 and decoder 60, they comprise a one-pole sixty-four position rotary switch or commutator.

Counter 50 is a modulo sixty-four counter used as a divide-by sixteen followed by a divide-by four. Outputs Q1, Q2, Q3 and Q4 drive address inputs A0, A1, A2 and A3 respectively of the four analog switches 70, 71, 72 and 73. The four analog switches select sequentially from positions S1 through S16 as the counter increments from 0 to 15. This selection sequence is repeated three times as the counter increments from 15 to 63.

When each analog switch is enabled, its input is connected to the selected output. Outputs Q5 and Q6 of counter 50 drive decoder 60 which enables analog switch 70 for counts 0 through 15 via output Q0. Outputs Q1, Q2 and Q3 of decoder 60 enable analog switches 71, 72 and 73 for counts 16 through 31, 32 through 47, and 48 through 63 respectively. The count then increments to 0 and the cycle then repeats continuously. This causes the input signal to be switched to output load resistor 75 sequentially through the sixty-four capacitors of capacitor bank 74, generating the notches. The PLL tracks variations within approximately five percent of 60 Hz and adjusts the 3840 Hz VCO output signal by sixty-four times the deviation from 60 Hz causing a proportional change in the rotational frequency of the commutator and thereby causing the frequency of the notches to continuously track the interfering harmonics.

Thus this invention comprises two narrow passband analog filters which sample the two lowest harmonics of the interfering signal and, by controlling the frequency of a PLL with a counter in the feedback loop, continuously adjust the rotational frequency of a commutated capacitor-bank comb-notch filter to remove the interfering signal and its harmonics. If signals over half of the rotational frequency of the comb-notch filter are to be applied to the filter, the input signal should first be band limited by an anti-aliasing lowpass filter as shown in FIG. 1. An output smoothing filter should be employed to reduce the feedthrough of the 3840 Hz rotational frequency.

Obviously, many modifications and variations of the present invention are possible in the light of the above teachings. As an example, it is possible, since the PLL will lock to many harmonics of a signal other than the first two, to employ a different number of narrow passband analog filters tuned to one or more other harmonics of the interfering signal. Other variations within the scope of this invention regard the number of switch positions and thus the number of capacitors and the fundamental frequency of the interfering signal to be attenuated. It is, therefore, understood that within the scope of the appended claims, the invention may be practiced otherwise than as specifically described.

What is claimed is:

1. A tracking harmonic filter for automatically tracking and removing harmonically related interfering electrical signals which comprises:
    a relatively narrow band electronic commutated capacitorbank comb-notch filter and receiving the interfering electrical signals and providing an output of the tracking harmonic filter;
    a counter/decoder circuit connected to said comb-notch filter to provide an input thereto;
    a phase locked loop circuit connected to said counter/decoder circuit for providing an input to said counter/decoder circuit;
    a pair of narrow band analog filters tunable respectively to two lowest harmonics of said interfering electrical signals and receiving the interfering electrical signals;
    summing means for adding the outputs of said two analog filters; and
    means for applying the summed output of said two analog filters as an input to said phase locked loop circuit.

2. The tracking harmonic filter of claim 1 wherein said narrow band electronic commutated capacitor-bank comb-notch filter includes a plurality of analog switch integrated circuits.

3. The tracking harmonic filter of claim 2 wherein said narrow band electronic commutated capacitor-bank comb-notch filter further includes a plurality of capacitor banks, each capacitor bank connected to a corresponding member of said plurality of analog switch integrated circuits.

4. The tracking harmonic filter of claim 3 which further includes an anti-aliasing filter receiving the interfering electrical signals.

5. The tracking harmonic filter of claim 4 which also includes a smoothing filter receiving the output of the tracking harmonic filter.

* * * * *